(12) United States Patent
Jeng et al.

(10) Patent No.: US 7,888,194 B2
(45) Date of Patent: Feb. 15, 2011

(54) METHOD OF FABRICATING SEMICONDUCTOR DEVICE

(75) Inventors: Li-Shian Jeng, Taitung (TW);
Cheng-Tung Huang, Kaohsiung (TW);
Shyh-Fann Ting, Kaohsiung County (TW); Wen-Han Hung, Kaohsiung (TW); Kun-Hsien Lee, Tainan (TW);
Meng-Yi Wu, Kaohsiung Hsien (TW);
Tzyy-Ming Cheng, Hsinchu (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 231 days.

(21) Appl. No.: 11/681,987

(22) Filed: Mar. 5, 2007

(65) Prior Publication Data

US 2008/0220574 A1 Sep. 11, 2008

(51) Int. Cl.
*H01L 21/8238* (2006.01)

(52) U.S. Cl. .................. 438/199; 438/231; 438/305; 438/528; 438/530; 438/532; 257/E21.147; 257/E21.431; 257/E21.435

(58) Field of Classification Search ................ 438/199, 438/520, 522, 231, 305, 595, 528, 530, 532; 257/E21.431, E21.435, E21.147
See application file for complete search history.

(56) References Cited

U.S. PATENT DOCUMENTS 6,153,455 A * 11/2000 Ling et al. ................. 438/231
6,242,312 B1 * 6/2001 Huang et al. .............. 438/305
6,559,015 B1 * 5/2003 Yu ............................ 438/301
6,656,853 B2 * 12/2003 Ito ............................ 438/778
2006/0046367 A1 * 3/2006 Rotondaro et al. ........ 438/199
2006/0246641 A1 * 11/2006 Kammler et al. .......... 438/184
2008/0124858 A1 * 5/2008 Nguyen et al. ............ 438/217

OTHER PUBLICATIONS

A. Shimizu et al., "Local Mechanical-Stress Control (LMC) : A New Technique for CMOS-Performance Enhancement" Electron Devices Meeting, 2001, IEDM Technical Digest. International, 2001 IEEE, pp. 19.4.1-19.4.4.

* cited by examiner

*Primary Examiner*—Mary Wilczewski
*Assistant Examiner*—Toniae M Thomas
(74) *Attorney, Agent, or Firm*—Winston Hsu; Scott Margo

(57) ABSTRACT

A method of fabricating a complementary metal oxide semiconductor (CMOS) device is provided. A first conductive type MOS transistor including a source/drain region using a semiconductor compound as major material is formed in a first region of a substrate. A second conductive type MOS transistor is formed in a second region of the substrate. Next, a pre-amorphous implantation (PAI) process is performed to amorphize a gate conductive layer of the second conductive type MOS transistor. Thereafter, a stress-transfer-scheme (STS) is formed on the substrate in the second region to generate a stress in the gate conductive layer. Afterwards, a rapid thermal annealing (RTA) process is performed to activate the dopants in the source/drain region. Then, the STS is removed.

10 Claims, 3 Drawing Sheets

METHOD OF FABRICATING SEMICONDUCTOR DEVICE

BACKGROUND OF THE INVENTION

1. Field of the Invention

The present invention relates to a method of fabricating an integrated circuit. More particularly, the present invention relates to a method of fabricating a complementary metal oxide semiconductor (CMOS) device.

2. Description of Related Art

Along with the progress in the development of electronic devices such as communication electronic devices, the operating speed of transistors is growing faster. However, limited by the moving speed of electrons and holes in a silicon channel, the application range of transistors is also restricted.

A method using a mechanical stress in channel to improve the moving speed of electrons and holes in the channel is an effective way to eliminate the limitation caused by the scaling down of a device.

A conventional technique using a material such as SiGe expitaxy as a main component of a source/drain region of a transistor has been proposed. First, a portion of the substrate in which a source/drain region is predetermined to be formed is removed, and SiGe is refilled by using a selective area epitaxy growth technique. SiGe is used as the main component of the source/drain region. Compared with the material characteristics of Si, Ge has smaller electron effective mass and hole effective mass, so that the source/drain region formed by SiGe can increase the mobility of electrons and holes, thereby enhancing the performance of the device.

According to another method, after an ion implantation process in the source/drain region of the transistor and before a rapid thermal annealing (RTA) process, a layer of stress-transfer-scheme (STS) is covered on the substrate for providing a stress to a gate conductive layer, and then the STS is removed, such that the stress memory effect generated by the STS to the gate conductive layer is used to enhance the ion performance of the device.

However, if SiGe is used as the main component of the source/drain region and meanwhile the STS technology is adopted, the ion performance of the device cannot be effectively enhanced.

The reason is that the STS when applied in a conventional transistor device is deposited after the ion implantation process for forming a source/drain contact region is performed. The energy for the ion implantation process in the source/drain contact region is high enough to amorphize the polysilicon of the gate conductive layer into amorphous silicon, and the amorphous silicon has an excellent stress memory effect generated by the STS, so after the STS is removed, the stress memory of the amorphous silicon can improve the ion performance of the device.

However, when SiGe is used as the main component of the source/drain region, the SiGe expitaxy process is performed at a temperature up to 700° C.-900° C. for 3-4 hours, thus generating an over-high thermal budget, such that the gate conductive layer is recrystallized into polysilicon. The ion implantation process in the source/drain contact region of an n-type channel MOS (NMOS) is performed before the SiGe expitaxy process, so before the STS is formed, only an ion implantation process of low energy in a source/drain extension region is performed. However, the energy for the ion implantation process in the source/drain extension region is insufficient to completely amorphize the gate conductive layer into amorphous silicon, so the stress memory generated by the STS to the gate conductive layer is not sufficient to effectively enhance the ion performance of the device.

SUMMARY OF THE INVENTION

The present invention is directed to provide a method of fabricating a semiconductor device to prevent the influence caused by an over-high thermal budget of a SiGe expitaxy process, such that the stress memory effect generated by the STS to the gate conductive layer can be used to enhance the ion performance of a device.

The present invention is further directed to provide a method of fabricating a CMOS device so as to prevent the influence caused by an over-high thermal budget of the SiGe expitaxy process, such that the stress memory effect generated by the STS to the gate conductive layer can be used to enhance the ion performance of a device.

The present invention provides a method of fabricating a CMOS device. First, a substrate comprising a first region and a second region is provided. A first conductive type MOS field effect transistor (FET) is formed on the substrate in the first region, and the first conductive type MOSFET comprises a first gate structure and a first source/drain region using a semiconductor compound as a major material. A second conductive type MOSFET is formed on the substrate in the second region, and the second conductive type MOSFET comprises a second gate structure and a second source/drain region. Then, after the first and second conductive type MOSFETs are formed, a pre-amorphous implantation (PAI) process is performed to amorphize a gate conductive layer of the second gate structure in the second region. Thereafter, an STS is formed on the substrate in the second region after the PAI process. Then, an RTA process is performed. After that, the STS is removed.

In the method of fabricating a CMOS device according to an embodiment of the present invention, the method of forming the first and second conductive type MOSFETs first forms a first gate structure and a second gate structure respectively in the first region and the second region of the substrate at the same time, wherein the first and second gate structures comprise a gate dielectric layer, a gate conductive layer, and a first spacer respectively. Then, a second conductive type source/drain contact region is formed in the substrate around the sidewalls of the first spacer of the second region and the first region respectively. Afterwards, the substrate of the second conductive type source/drain contact region of the first region is removed, and the semiconductor compound having a first conductive type dopant is formed therein to form the first conductive type source/drain contact region. Then, the first spacers of the first region and the second region are removed. Afterwards, a first conductive type source/drain extension region is formed in the substrate around the gate conductive layer in the first region, and a second conductive type source/drain extension region is formed in the substrate around the gate conductive layer in the second region. After that, a second spacer is formed at the sidewalls each of the gate conductive layers in the first region and in the second region.

In the method of fabricating a CMOS device according to an embodiment of the present invention, the first conductive type is p-type, the second conductive type is n-type, and the semiconductor compound layer comprises SiGe.

In the method of fabricating a CMOS device according to an embodiment of the present invention, the first conductive type is n-type, the second conductive type is p-type, and the semiconductor compound layer comprises SiC.

In the method of fabricating a CMOS device according to an embodiment of the present invention, the atom used in the PAI process is selected from a group consisting of Ge, As, (CS Sb, and a combination thereof.

In the method of fabricating a CMOS device according to an embodiment of the present invention- the :second source/drain region comprises a second conductive type source/drain extension region and a second conductive type source/drain contact region, and the energy for performing the PAI process is less than the, energy for performing the ion implantation process for forming the second source/drain contact region.

In the method of fabricating a CMOS device according to an embodiment of the present invention, the second source/drain region comprises a second conductive type source/drain extension region and a second conductive type source/drain contact region, and the energy for performing the PAI process is larger than the energy for performing the ion implantation process for forming the second source/drain extension region.

In the method of fabricating a CMOS device according to an embodiment of the present invention, the second source/drain region comprises a second conductive type source/drain extension region and a second conductive type source/drain contact region, and the energy for performing the PAI process is between the energy for performing the ion implantation process for forming the second source/drain extension region and the energy for performing the ion implantation process for forming the second source/drain contact region.

In the method of fabricating a CMOS device according to an embodiment of the present invention, the atom used in the PAI process is Ge, and the energy for the PAI process is about 5-20 KeV.

In the method of fabricating a CMOS device according to an embodiment of the present invention, the material of the STS comprises $Si_xO_y$ or $Si_xN_y$.

The present invention provides a method of fabricating a semiconductor device. First, an MOSFET comprising a gate structure and a source/drain region is formed in the substrate. Next, a PAI process is performed to amorphize a gate conductive layer of the gate structure. Afterwards, an STS is formed on the substrate. Then, an RTA process is performed. After that, the STS is removed.

In the method of fabricating a semiconductor device according to an embodiment of the present invention, the atom used in the PAI process is selected from a group consisting of Ge, As, C, Sb, and a combination thereof.

In the method of fabricating a semiconductor device according to an embodiment of the present invention, the source/drain region comprises a source/drain extension region and a source/drain contact region, and the energy for performing the PAI process is less than the energy for performing the ion implantation process for forming the source/drain contact region.

In the method of fabricating a semiconductor device according to an embodiment of the present invention, the source/drain region comprises a source/drain extension region and a source/drain contact region, and the energy for performing the PAI process is larger than the energy for performing the ion implantation process for forming the source/drain extension region.

In the method of fabricating a semiconductor device according to an embodiment of the present invention, the energy for performing the PAI process is between the energy for performing the ion implantation process for forming the source/drain extension region and the energy for performing the ion implantation process for forming the source/drain contact region.

In the method of fabricating a semiconductor device according to an embodiment of the present invention, the atom used in the PAI process is Ge, and the energy for the PAI process is about 5-20 KeV.

In the method of fabricating a semiconductor device according to an embodiment of the present invention, the material of the STS comprises $Si_xO_y$ or $Si_xN_y$.

In the method of fabricating a semiconductor device according to an embodiment of the present invention, the method of forming an MOSFET first forms a gate structure comprising a gate dielectric layer, a gate conductive layer, and a first spacer on the substrate. Then, a source/drain contact region is formed in the substrate. Afterwards, the first spacer is removed, and a source/drain extension region is formed in the substrate around the gate conductive layer. After that, a second spacer is formed at the sidewalls of the gate conductive layer.

The PAI process of the present invention can prevent the influence caused by an over-high thermal budget of the SiGe expitaxy process, such that the stress memory effect generated by the STS to the gate conductive layer is used to enhance the ion performance of the device.

In order to make the aforementioned and, other objectives, features, and advantages of the present invention comprehensible, preferred embodiments accompanied with figures are described in detail below.

DESCRIPTION OF EMBODIMENTS

Figure 1:
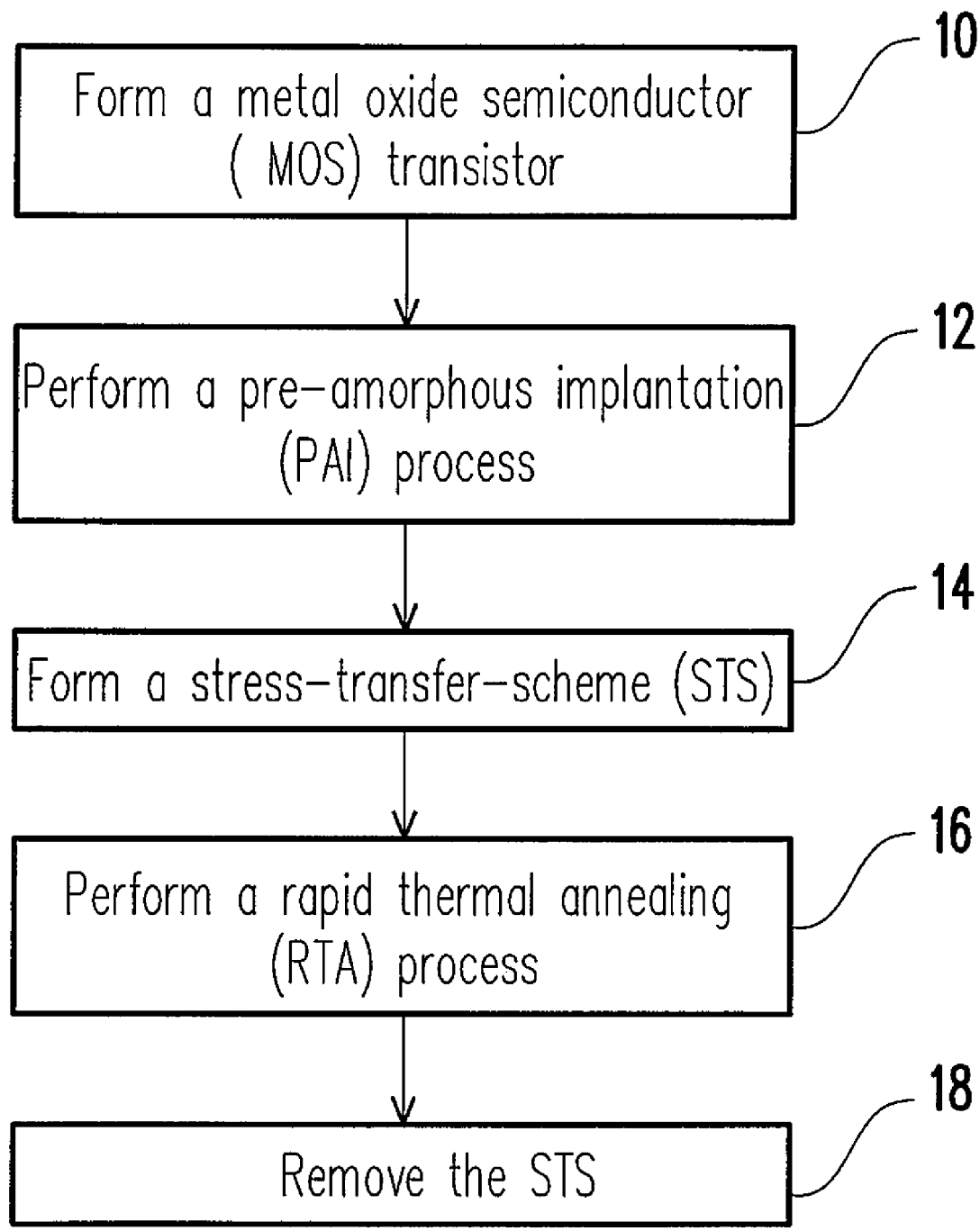
FIG. 1 is a flow chart of a method of fabricating a semiconductor device according to an embodiment of the present invention.

FIG. 1 is a flow chart of a method of fabricating a semiconductor device according to an embodiment of the present invention.

Referring to FIG. 1, according to an embodiment of the present invention, an MOS transistor is first formed on a substrate (Step 10). After the fabrication of the MOS transistor and before an RTA process, a PAI process is performed (Step 12) to amorphize a gate conductive layer into amorphous silicon, such that the stress memory effect generated by a subsequently deposited STS can be utilized to enhance an ion performance of device. The atom used in the PAI process is selected from a group consisting of Ge, As, C, Sb, and a combination thereof. The energy for performing the PAI process is between the energy for performing an ion implantation process for forming a source/drain extension region- and the energy for performing an ion implantation process for forming a source/drain contact region. Then, a layer of STS is formed on the substrate (Step 14), so as to transfer the stress to the gate conductive layer. Afterwards, an RTA process is performed (Step 16) to activate the dopants in the source/drain region. Then, the STS is removed (Step 18).

The present invention performs the PAI process before the RTA process for activating the dopants in the source/drain region, so as to amorphize the gate conductive layer into amorphous silicon with a preferred stress memory characteristic. Therefore, after removing the STS, the stress generated by the STS to the gate conductive layer can still be memorized in the gate conductive layer for enhancing the ion performance.

The manufacturing flow of a CMOS device is illustrated below.

FIGS. 2A-2F are schematic sectional views of the flow of a method of fabricating a CMOS device according to an embodiment of the present invention.

Figure 2A:
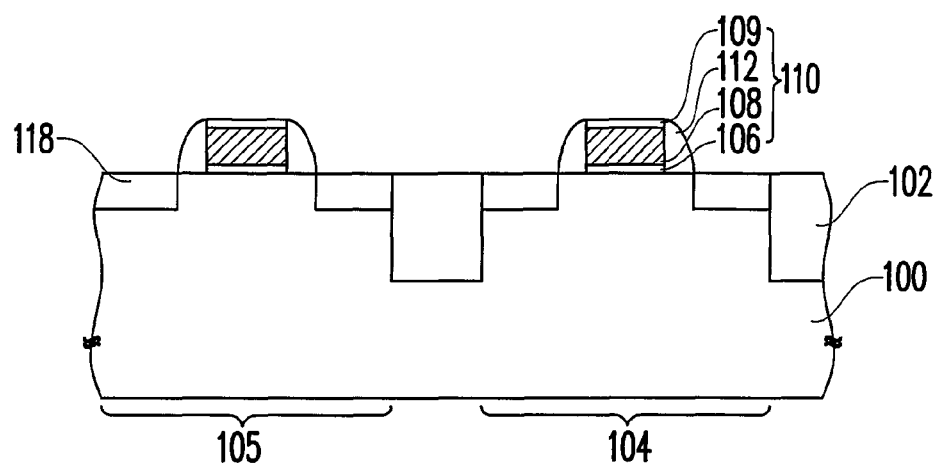
FIGS. 2A-2F are schematic sectional views of the flow of a method of fabricating a CMOS device according to an embodiment of the present invention.

First, referring to FIG. 2A, a substrate 100, for example, a monocrystalline silicon substrate, is provided. An isolation structure 102 is formed in the substrate, 100 to define active regions 104 and 105. The material of the isolation structure 102 is, for example, an insulating material such as silicon oxide. The method of forming the isolation structure 102 involves, for example, forming a trench in the substrate 100, depositing a layer of insulating material on the substrate 100, and then removing the excessive insulating material by performing a chemical-mechanical polishing process.

Then, a gate structure 110 is formed on the substrate 100 in the active regions 104, 105 respectively. The gate structure 110 is composed of, for example, a gate dielectric layer 106, a gate conductive layer 108, a cap layer 109, and a spacer 112. The method of forming the gate structure 110 involves, for example, first forming a dielectric material layer (not shown) on the substrate 100. The material of the dielectric material layer is, for example, silicon oxide, and the forming method thereof is, for example, thermal oxidation. Afterwards, a conductive material layer (not shown) is formed on the dielectric material layer to cover the entire substrate 100. The material of the conductive material layer is, for example, polysilicon or doped polysilicon, and the forming method is, for example, chemical vapor deposition (CVD). Thereafter, a cap material layer (not shown) is formed on the conductive material layer, wherein the material of the cap material layer is, for example, $Si_xO_y$ or $Si_xN_y$, and the forming method is, for example, CVD. Then, a lithographic process and an etching process are performed to pattern the cap material layer, conductive material layer, and dielectric material layer, so as to form the cap layer 109, conductive layer 108, and gate dielectric layer 106. After that, the spacer 112 is formed at the sidewalls of the cap layer 109 and the gate conductive layer 108, and the material of the spacer 112 is, for example, $Si_xO_y$ or $Si_xN_y$. Then, an ion implantation process is preformed to form a source/drain contact region 118 in the active regions 105 and 104. In an embodiment, an NMOS transistor is preformed in the active region 105, and the dopants in the source/drain, contact region 118 are n-type. In another embodiment, a PMOS transistor, is preformed in the active region 105, and the dopants in the source/drain contact, regions 118 are p-type. The n-type dopants are, for example, P or As, and the p-type dopants are, for example, B. In an embodiment, the energy for the ion implantation process in the source/drain contact region 118 is about 10-30 KeV.

Figure 2B:
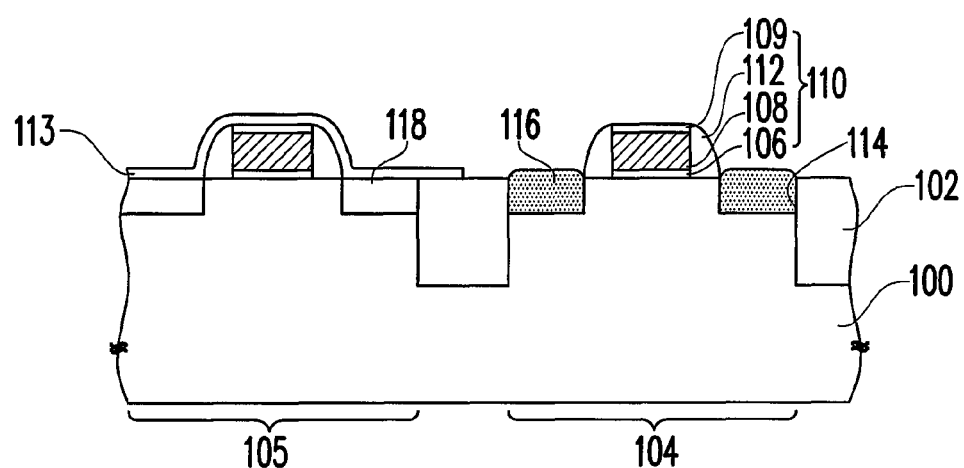
Figure 2C:
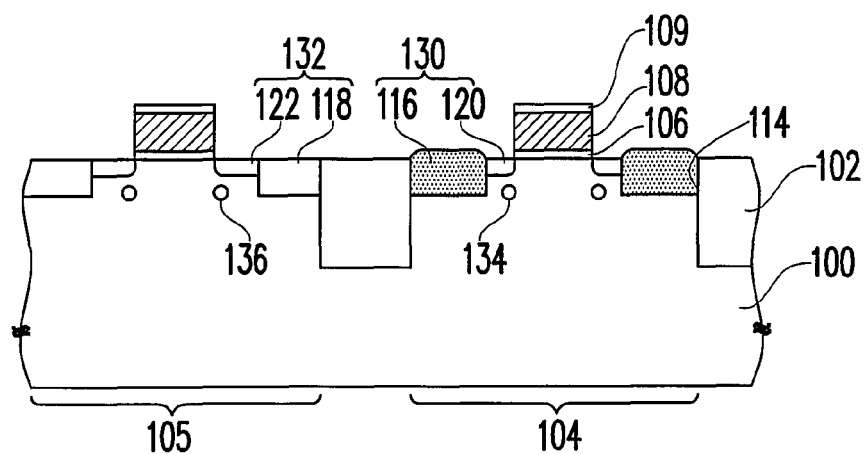

Next, referring to FIG. 2B, a mask layer 113 is covered on the active region 105. The mask layer 113 can be formed by the following steps. First, a mask material layer (not shown) is covered on the substrate 100. Next, a patterned photoresist layer (not shown) is formed on the cap material layer. Then, the photoresist layer is used as an etching mask to pattern the cap material layer. And finally, the patterned photoresist layer is removed. The material of the cap material layer 113 is, for example, silicon oxide, and the forming method is, for example, high temperature oxide (HTO) process.

Then, the substrate 100 in the active region 104 of the source/drain contact region 118 is removed to form grooves 114 in the substrate 100 at both sides of the spacer 112 in the active region 104. A semiconductor compound is refilled in the grooves 114, which functions as a source/drain contact region. The grooves 114 can be formed by anisotropic etching.

Thereafter, referring to FIG. 2B again, a selective area epitaxy growth process is performed to epitaxially grow semiconductor compound expitaxy layers in the grooves 114 and form dopants in the semiconductor compound expitaxy layers, so as to form source/drain contact regions 116.

In an embodiment, an NMOS transistor is preformed in the active region 105, and the dopants in the source/drain contact region 118 are n-type. A PMOS transistor is preformed in the active region 104, and the semiconductor compound expitaxy layer in the source/drain contact region 116 is, for example, a SiGe layer, wherein the dopants in the source/drain contact region 116 are p-type. The method of forming SiGe involves first introducing a gas source containing Si such as $SiH_4$, $CH_2Cl_2$, or a combination thereof, a gas source containing Ge such as $GeH_4$, HCl, and a dopant gas source such as $BH_3$ as a reactive gas source into a CVD reaction chamber and then depositing at a temperature of 700-900° C. for 3-4 hours.

In another embodiment, a PMOS transistor is preformed in the active region 105, and the dopants in the source/drain contact region 118 are p-type. An NMOS transistor is preformed in the active region 104, and the semiconductor compound expitaxy layer in the source/drain contact region 116 is, for example, a SiC layer, wherein the dopants are n-type.

Afterwards, referring to 2C, the mask layer 113 is removed, and the spacers 112 in the active regions 104, 105 are also removed. Then, a photoresist mask layer is formed respectively, and an ion implantation process and a pocket ion implantation process are performed to form source/drain extension regions 120 and pocket implantation regions 134 and form source/drain extension regions 122 and pocket implantation regions 136 in the substrate 100 in the active regions 104 and 105 respectively. The source/drain extension region 120 and the source/drain contact region 116 constitute a source/drain region 130. The source/drain extension region 122 and the source/drain contact region 118 constitute a source/drain region 132. In an embodiment, an NMOS transistor is preformed in the active region 105, and the dopants in the source/drain extension region 122 are n-type. A PMOS transistor is preformed in the active region 104, and the dopants in the source/drain extension region 120 are p-type. In another embodiment, a PMOS transistor is preformed in the active region 105, and the dopants in the source/drain extension region 122 are p-type. An NMOS transistor is preformed in the active region 104, and the dopants in the source/drain extension region 120 are n-type.

Figure 2D:
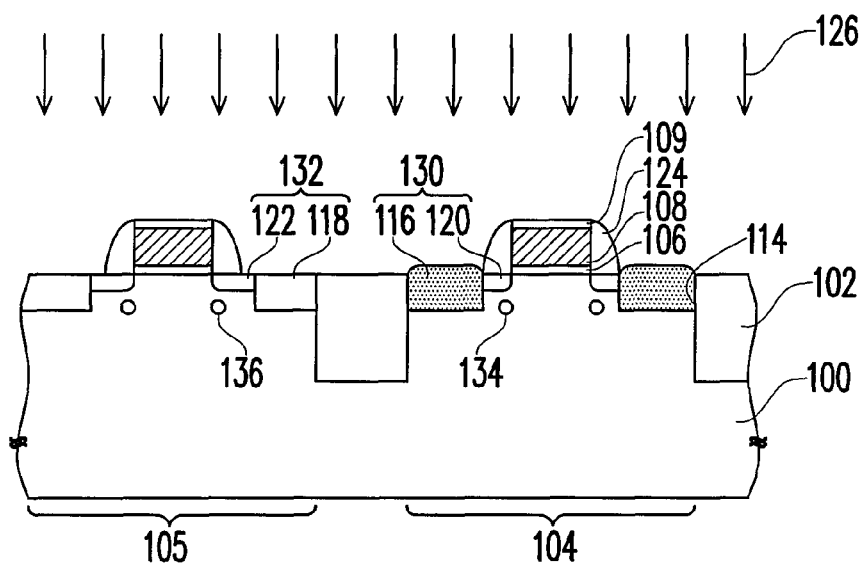

Next, referring to FIG. 2D, a spacer 124 is formed at the sidewalls of the cap layer 109 and the gate conductive layer 108 in the active regions 104, 105 respectively. Next, a PAI process 126 is performed to amorphize the gate conductive layer 108 of each gate structure 110. The atom used in the PAI process 126 is selected from a group consisting of Ge, As, C, Sb, and a combination thereof. The energy for performing the PAI process 126 is between the energy for performing an ion implantation process for forming the source/drain extension region 122 and the energy for performing an ion implantation process for forming the source/drain contact region 118. In an embodiment, the energy for the ion implantation process in the source/drain extension region 122 is about 2-4 KeV. The energy for the ion implantation process in the source/drain contact region 118 is about 10-30 KeV. The atom used in the PAI process is Ge and the energy required is about 5-20 KeV.

Figure 2E:
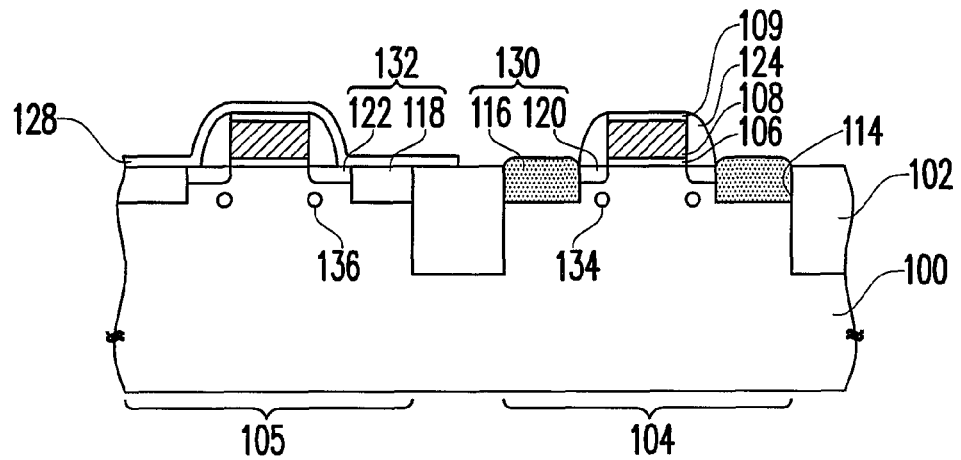

Afterwards, referring to FIG. 2E, after the PAI process 126, an STS 128 is formed on the active region 105 for producing a stress in the gate conductive layer 108. The STS 128 can be formed by the following steps. First, an STS material layer is formed on the substrate 100. Then, a patterned photoresist layer is formed on the active region 105 of the substrate 100.

Afterwards, the patterned photoresist layer is used as an etching mask to etch the STS material layer while leaving the STS 128 on the active region 105. Finally, the patterned photoresist layer is removed. The STS material layer is, for example, a $Si_xN_y$ layer or a $Si_xO_y$ layer, and the forming method thereof can be CVD. Thereafter, an RTA process is performed to activate the dopants in the source/drain regions 130, 132.

Figure 2F:
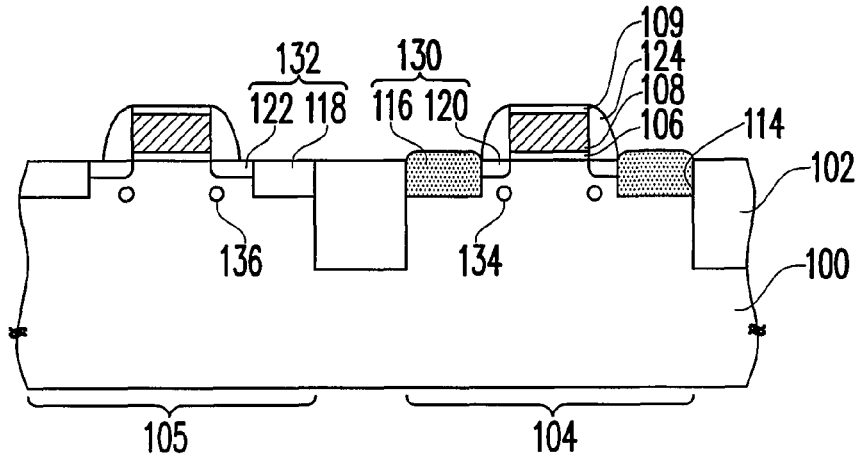

Then, referring to FIG. 2F, the STS 128 is removed. The STS 128 can be removed by isotropic etching, for example, wet etching. When the material of the STS 128 is $Si_xO_y$, hydrofluoric acid or buffered oxide etch (BOE) can be adopted as an etching solution to remove the STS 128. While when the material of the STS 128 is $Si_xN_y$, hot phosphoric acid can be adopted as an etching solution to remove the STS 128.

The present invention performs the PAI process before the RTA process, so as to amorphize the gate conductive layer which is being crystallized under an over-high thermal budget of the expitaxy process into amorphous silicon with preferred stress memory characteristic. Therefore, after removing the STS, the stress generated by the STS to the gate conductive layer can still be memorized in the gate conductive layer for enhancing the ion performance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a complementary metal oxide semiconductor (CMOS) device, comprising:
    providing a substrate which comprises a first region and a second region;
    forming a first conductive type MOS field effect transistor (FET) on the substrate in the first region, wherein the first conductive type MOSFET comprises a first gate structure and a first source/drain region using a semiconductor compound as major material;
    forming a second conductive type MOSFET in the substrate in the second region, wherein the second conductive type MOSFET comprises a second gate structure and a second source/drain region;
    performing a pre-amorphous implantation (PAI) process after the first and second conductive type MOSFETs are formed, so as to amorphize a gate conductive layer of the second gate structure in the second region;
    forming a stress-transfer-scheme (STS) on the substrate in the second region;
    performing a rapid thermal annealing (RTA) process; and
    removing the STS.

2. The method of fabricating a CMOS device as claimed in claim 1, wherein the process of forming the first and second conductive type MOSFETs comprises:
    respectively forming the first gate structure and the second gate structure on the substrate in the first region and the second region simultaneously, wherein the first and second gate structures respectively comprise a gate dielectric layer, a gate conductive layer, a cap layer, and a first spacer;
    respectively forming a second conductive type source/drain contact region in the substrate around the sidewalls of the first spacer of the second region and the first region;
    removing the substrate in the second conductive type source/drain contact region in the first region, and forming the semiconductor compound having a first conductive type dopant therein to form the first conductive type source/drain contact region;
    removing the first spacers of the first region and the second region;
    forming a first conductive type source/drain extension region in the substrate around the gate conductive layer of the first region;
    forming a second conductive type source/drain extension region in the substrate around the gate conductive layer of the second region; and
    forming a second spacer at the sidewalls each of the gate conductive layers and the cap layers in the first and second regions.

3. The method of fabricating a CMOS device as claimed in claim 1, wherein the first conductive type is p-type, the second conductive type is n-type, and the semiconductor compound layer comprises SiGe layer.

4. The method of fabricating a CMOS device as claimed in claim 1, wherein the first conductive type is n-type, the second conductive type is p-type, and the semiconductor compound layer comprises SiC layer.

5. The method of fabricating a CMOS device as claimed in claim 1, wherein the atom used in the PAI process is selected from a group consisting of Ge, As, C, Sb, and a combination thereof.

6. The method of fabricating a CMOS device as claimed in claim 1, wherein the second source/drain region comprises a second conductive type source/drain extension region and a second conductive type source/drain contact region, and the energy for performing the PAI process is less than the energy for performing an ion implantation process for forming the second source/drain contact region.

7. The method of fabricating a CMOS device as claimed in claim 1, wherein the second source/drain region comprises a second conductive type source/drain extension region and a second conductive type source/drain contact region, and the energy for performing the PAI process is larger than the energy for performing an ion implantation process for forming the second source/drain extension region.

8. The method of fabricating a CMOS device as claimed in claim 7, wherein the second source/drain region comprises a second conductive type source/drain extension region and a second conductive type source/drain contact region, and the energy for performing the PAI process is between the energy for performing an ion implantation process for forming the second source/drain extension region and the energy for performing an ion implantation process for forming the second source/drain contact region.

9. The method of fabricating a CMOS device as claimed in claim 8, wherein the atom used in the PAI process is Ge, and the energy for the PAI process is about 5-20 KeV.

10. The method of fabricating a CMOS device as claimed in claim 1, wherein the material of the STS comprises $Si_xO_y$ or $Si_xN_y$.

* * * * *